United States Patent
Du

(10) Patent No.: US 6,459,609 B1
(45) Date of Patent: Oct. 1, 2002

(54) SELF REFERENCING 1T/1C FERROELECTRIC RANDOM ACCESS MEMORY

(75) Inventor: Xiao Hong Du, Colorado Springs, CO (US)

(73) Assignee: Ramtron International Corporation, Colorado Springs, CO (US)

(*) Notice: Subject to any disclaimer, the term of this patent is extended or adjusted under 35 U.S.C. 154(b) by 0 days.

(21) Appl. No.: 10/022,119

(22) Filed: Dec. 13, 2001

(51) Int. Cl.[7] .............................................. G11C 11/22
(52) U.S. Cl. .................. 365/145; 365/149; 365/189.07; 365/207
(58) Field of Search ................................ 365/145, 149, 365/189.07, 207

(56) References Cited

U.S. PATENT DOCUMENTS

| 4,888,733 A | | 12/1989 | Mobley |
| 5,031,143 A | * | 7/1991 | Jaffe ............................ 327/51 |
| 5,086,412 A | | 2/1992 | Jeffe et al. |
| 5,262,982 A | | 11/1993 | Brassington et al. |
| 5,754,466 A | * | 5/1998 | Arase .......................... 365/145 |
| 5,889,695 A | | 3/1999 | Kawagoe |
| 5,969,979 A | * | 10/1999 | Hirano ........................ 365/145 |
| 5,995,407 A | | 11/1999 | Kamp |
| 6,008,659 A | | 12/1999 | Traynor |

FOREIGN PATENT DOCUMENTS

| EP | 0 926685 A2 | * | 6/1999 | ........... G11C/11/12 |

* cited by examiner

*Primary Examiner*—Richard Elms
*Assistant Examiner*—Toan Le
(74) *Attorney, Agent, or Firm*—William J. Kubida, Esq.; Peter J. Meza, Esq.; Hogan & Hartson, LLP

(57) ABSTRACT

An implementation of 1T/1C nonvolatile ferroelectric RAMS without using any reference cells—the polarization state in a memory cell is determined by applying two consecutive plate pulses on the ferroelectric capacitor in the memory cell, preamplifying the bit line voltages corresponding to these two plate pulses, and comparing the preamplified voltages. The two consecutive plate pulses have the same polarity.

22 Claims, 4 Drawing Sheets

SELF REFERENCING 1T/1C FERROELECTRIC RANDOM ACCESS MEMORY

BACKGROUND OF THE INVENTION

The present invention relates to ferroelectric memories, and, more particularly, to self-referencing schemes for a 1T/1C ferroelectric memory in which the memory cell itself serves as a reference for determining the stored memory state.

Nonvolatile ferroelectric random access memories (FRAM®— trademark of Ramtron International Corporation of Colorado Springs, Colo.) realize the memory function by the use of two different polarization states (generally referred to as "up" and "down" polarizations) in the ferroelectric cell capacitors, which are used to distinguish between a logic zero and a logic one data state. It has long been a key issue to build reliable memory references that can be used to distinguish between the two polarization states in a 1T/1C cell structure.

There are two existing types of "stand-alone" memory references: voltage references and capacitance references. Both of these types of references are susceptible to the variations in the quality, the dimensions, and the remanent polarizations of the ferroelectric films used in the memory cells. Even for an initially uniform memory array, non-uniform operations on the memory cells introduce substantial fluctuations in the ferroelectric properties of the ferroelectric films in the memory cells, due to uncontrollable effects such as polarization imprint and fatigue in the ferroelectric films. In addition, if the reference cells are built with the same ferroelectric materials, the reference cells will suffer much more imprint and fatigue than memory cells since the reference cells experience many more accesses. This therefore limits the reliability and endurance of the FRAM memory.

In a 1T/1C ferroelectric memory with stand-alone reference cells, one reference is shared by memory cells in a segment or a section. The reference level must be always between the minimum of the bit line voltages corresponding to the logic one data state and the maximum of the bit line voltages corresponding to the logic zero data state among these memory cells. However, both the minimum and the maximum changes with processing variations, temperature, and time. Even for an originally uniform array, the array will lose its uniformity during real operations since cells usually experience different access frequencies. Furthermore, the reference level also shifts with time and temperature. Because of these uncontrollable and unpredictable variations, it is extremely difficult to build a reference that works reliably for all the specified time and temperature ranges.

What is desired, therefore, is a robust self-referencing circuit and method for a 1T/1C ferroelectric memory array that overcomes the inherent performance limitations of the existing stand-alone voltage and capacitive references.

SUMMARY OF THE INVENTION

According to the present invention, a circuit and method is disclosed for reading data from a 1T/1C nonvolatile ferroelectric random access memory without using any stand-alone reference circuits. The polarization state in a given 1T/1C memory cell in an array is determined by applying two consecutive plate pulses on the ferroelectric capacitor in the memory cell, preamplifying the bit line voltages corresponding to these two plate pulses, and comparing the preamplified voltages. The two consecutive plate pulses have the same polarity.

The storage information in a ferroelectric memory cell is read out by comparing the responses of the same cell to two consecutive plate line pulses. The self-reference scheme of the present invention substantially reduces the requirement on the uniformity of the ferroelectric films in the memory cells. All the reliability issues related to stand-alone reference cells are eliminated because no stand-alone reference is used. Thus, the reliability of the memory is substantially enhanced.

In addition, the worst case condition in a 1T/1 C FRAM memory with stand-alone reference cells is when an opposite "P" term and an opposite "U" term exist in an array because the margin between "P" and "U" terms becomes minimal in this case. This situation will not be an issue in the self-referencing scheme of the present invention because these two terms are not compared when the ferroelectric capacitor in a memory cell is driven by two plate pulses in the same direction.

Although the self-referencing scheme eliminates the problems mentioned above, the signal margin on the bit lines are as small as those in 1T/1C FRAM memories using stand-alone reference cells. The signal margin on the bit lines decreases as the bit-line-to-cell ratio increases. This puts a limitation on the density of the FRAM memories. However, the present invention provides a way to greatly increase the signal margin by combining the self-referencing scheme with preamplifiers.

There is only one signal path per bit line with the self-referencing scheme of the present invention while there are two signal paths per bit line in a 1T/1C FRAM memory using stand-alone reference cells (one from the bit line and the other from the reference). Thus, a preamplifier can be safely used only with the self-referencing scheme. Using preamplifiers to increase the signal margin is an advantage that uniquely belongs to the self-referencing scheme.

The area efficiency of the memory layout is increased by using the self-referencing scheme and preamplifiers. Firstly, the bit line can be built much longer because of the increased signal margin. Secondly, there are no reference cells with associated control circuits, which add substantial area in a 1T/1C FRAM memory layout.

Operating speed is not reduced when compared to that of an equivalent 1T/1C FRAM memory using stand-alone reference cells. In the self-referencing scheme of the present invention, two plate line pulses are applied to the ferroelectric cell capacitors during a reading operation. In a 1T/1C FRAM memory using stand-alone reference cells, one plate line pulse is applied. However, the time required to pre-charge the reference cells and the reference bit lines plus the time taken by the control circuits for the reference cells may even take longer time than an extra plate pulse.

The foregoing and other objects, features and advantages of the invention will become more readily apparent from the following detailed description of a preferred embodiment of the invention, which proceeds with reference to the accompanying drawings.

DETAILED DESCRIPTION

Figure 1:
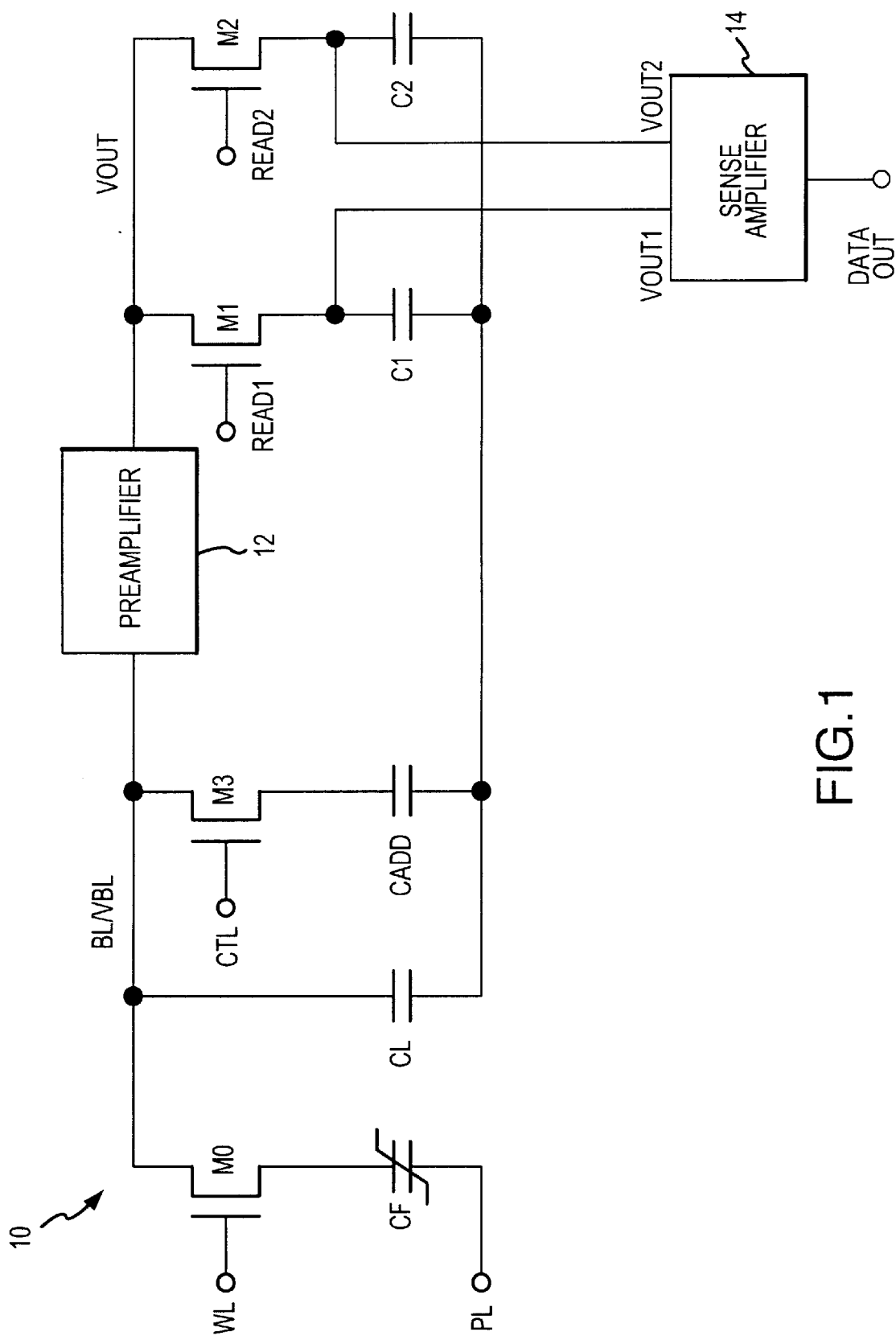
FIG. 1 is a schematic diagram of the self-referencing memory of the present invention.

Referring now to FIG. 1, a 1T/1C self-referencing FRAM memory 10, an associated preamplifier 12, and an associated sense amplifier 14 are shown. A ferroelectric capacitor CF and a MOSFET transistor MO comprise a ferroelectric memory cell. The gate of transistor MO is connected to a word line WL, which controls the access to the memory cell. A plate line PL is connected to one of the electrodes of the ferroelectric capacitor CF. Capacitor CL represents the bit line capacitance. Capacitor CADD is a capacitor which is connected to the bit line through transistor M3 during the first plate line pulse in a reading operation. The bit line is connected to the input of a voltage preamplifier 12. The preamplifier is an analogue amplifier with a single ended input and a single-ended output, while the "sense amplifier" 14 has two input terminals VOUT1 and VOUT2 and its output voltages are digital signals VDD and GROUND. The bit line is connected to a voltage preamplifier 12, which is to be distinguished from "sense amplifier" 14 for comparing voltages VOUT1 and VOUT2. There are two capacitors C1 and C2 with the same capacitance, which are connected to the output of the preamplifier through two transistors M1 and M2.

In a writing operation, the bit line BL is pulled up to the source voltage and the plate line PL is connected to ground to program the polarization in the ferroelectric capacitor downward. The plate line PL is pulled up to the source voltage and the bit line BL is connected to ground to program the polarization upward.

In a reading operation, the plate line PL is driven by two consecutive positive voltage pulses. Before each of the plate line pulses is applied, the bit line BL is discharged to ground and then floated. During the first plate line pulse, transistors M1 and M3 are turned on and transistor M2 is turned off. During the second plate line pulse, transistors M1 and M3 are off and transistor M2 is on. The bit line voltage VBL is amplified by preamplifier 12 and the output voltages during the two plate line pulses are sampled into capacitors C1 and C2, respectively. The voltages on capacitors C1 and C2 are fed into sense amplifier 14 after the two plate line pulses to resolve a valid data state.

Figure 2:
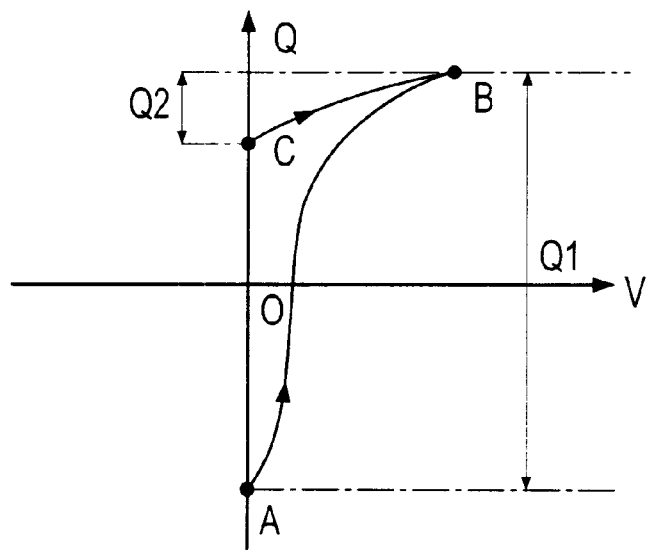
FIG. 2 is an illustration of reading a ferroelectric memory cell having downward polarization with reference to a section of a hysteresis loop.
Figure 3:
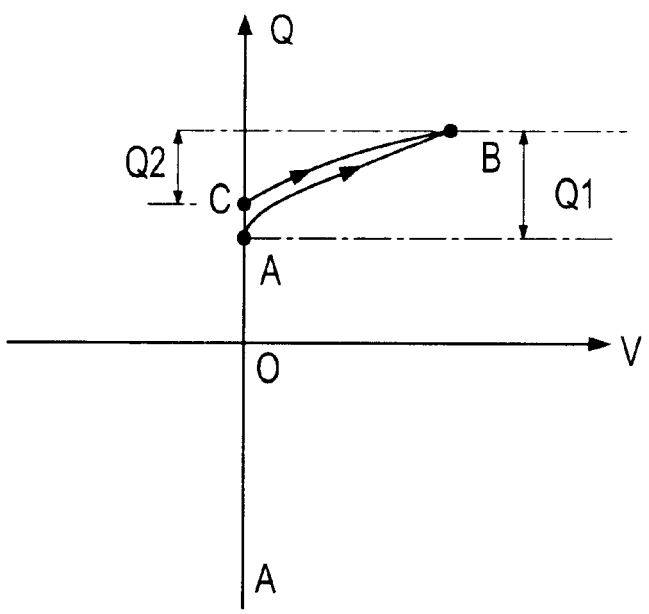
FIG. 3 is an illustration of reading a ferroelectric memory cell having upward polarization with reference to a section of a hysteresis loop.

FIGS. 2 and 3 illustrate the charge changes on the ferroelectric capacitor CF under the two plate line pulses for initially downward and upward polarizations, respectively. Partial hysteresis loops are used to show the change in charge.

In FIG. 2, the polarization is initially downward at point A. The charge change on the ferroelectric capacitor CF is designated Q1 (Q1 is conventionally called the "P" term) during the first plate line pulse and designated Q2 during the second plate line pulse. For the downward polarization case, Q1 is much larger than Q2. Thus, the bit line voltage VBL during the first plate line pulse is higher than the bit line voltage VBL during the second plate line pulse, although the load capacitor CADD is added to the bit line BL only during the first plate line pulse. This difference is increased after the bit line voltages are amplified by preamplifier 12. The amplified voltages are sampled into capacitors C1 and C2 as previously explained. The voltages on capacitors C1 and C2 are then fed into sense amplifier 14 for further amplification and to resolve a valid data state.

In FIG. 3, the polarization is initially upward at point A. In this case, the Q1 and Q2 charges after each plate line pulse are close in value (Q1 is conventionally called the "U" term). However, the load capacitor CADD is connected to the bit line only during the first plate line pulse. Capacitor CADD is chosen in such a way that the bit line voltage VBL during the first plate line pulse is lower than the bit line voltage during the second plate line pulse for this case. As in the previous case, the two VBL voltages are amplified by preamplifier 12, sampled into capacitors C1 and C2, and fed into sense amplifier 14. The ratio of CADD/CL is chosen to optimize the signal margins for both cases.

In the following two tables, Vb11 is the bit line voltage after the first plate line pulse is administered and Vb12 is the bit line voltage after the second plate line pulse is administered. The next voltage term, $\Delta$Vb1, is the signal margin on the bit line, i.e. (Vb11−Vb12). Vout1 is the output voltage from preamplifier 12 input to sense amplifier 14 on the first plate line pulse. Vout2 is the output voltage from preamplifier 12 to sense amplifier 14 on the second plate line pulse. The final voltage term, $\Delta$Vout, is the signal margin to sense amplifier, i.e. (Vout2−Vout1). The terms normal, weak, and strong refer to normal, poor, and good processing on silicon, respectively. The voltages given refer to the power source voltages to the circuit, i.e. VDD or VCC in the conventional notations. The temperatures listed are the simulated operating temperature in degrees Centigrade. The voltages and voltage differences in the tables are measured in millivolts.

Table I shows the simulation results for a ferroelectric memory with 512 word lines connected to each bit line for a read operation of a data one logic state:

| Read "1" | Vb11 | Vb12 | $\Delta$Vb1 | Vout1 | Vout2 | $\Delta$Vout |
|---|---|---|---|---|---|---|
| 27 C., Normal, 1.3 V | 212 | 120 | 92 | 51 | 289 | 238 |
| 105 C., Weak, 1.235 V | 207 | 119 | 88 | 54 | 406 | 352 |
| −45 C., Strong, 1.365 V | 213 | 124 | 89 | 64 | 363 | 299 |
| −45 C., Normal, 1.235 V | 206 | 120 | 86 | 64 | 318 | 254 |
| 105 C., Strong, 1.365 V | 213 | 123 | 90 | 213 | 722 | 509 |

Table II shows the simulation results for a ferroelectric memory with 512 word lines connected to each bit line for a read operation of a data zero logic state:

| Read "0" | Vb11 | Vb12 | $\Delta$Vb1 | Vout1 | Vout2 | $\Delta$Vout |
|---|---|---|---|---|---|---|
| 27 C., Normal, 1.3 V | 84 | 117 | −33 | 542 | 308 | −234 |
| 105 C., Weak, 1.235 V | 83 | 112 | −29 | 545 | 344 | −201 |
| −45 C., Strong, 1.365 V | 87 | 121 | −34 | 598 | 377 | −221 |

-continued

| Read "0" | Vb11 | Vb12 | ΔVb1 | Vout1 | Vout2 | ΔVout |
|---|---|---|---|---|---|---|
| −45 C., Normal, 1.235 V | 82 | 114 | −32 | 457 | 318 | −139 |
| 105 C., Strong, 1.365 V | 85 | 120 | −35 | 917 | 731 | −186 |

A self-referencing ferroelectric memory has been shown for use with a 1T/1C memory cell structure. Two pulses are applied to the same plate line and the corresponding charges are transferred to the same bit line. In the pulsing scheme of the present invention, the opposite "P" term will never be compared with the opposite "U" term since the two pulses are applied on the ferroelectric capacitor in the same direction.

There is only one signal path in the self-referencing memory of the present—the bit line BL. The use of only one signal path is critically important to making the self-referencing scheme work because the preamplifier can be safely used only with one signal path. The difference between the bit line voltages during the two pulses is about 90 mV for reading a logic one and about 30 mV for reading a logic zero. These margins decrease with time. However, after being pre-amplified, the differential signals to the sense amplifier are at least 238 mv and 139 mV for reading logic one and zero, respectively.

Figure 4:
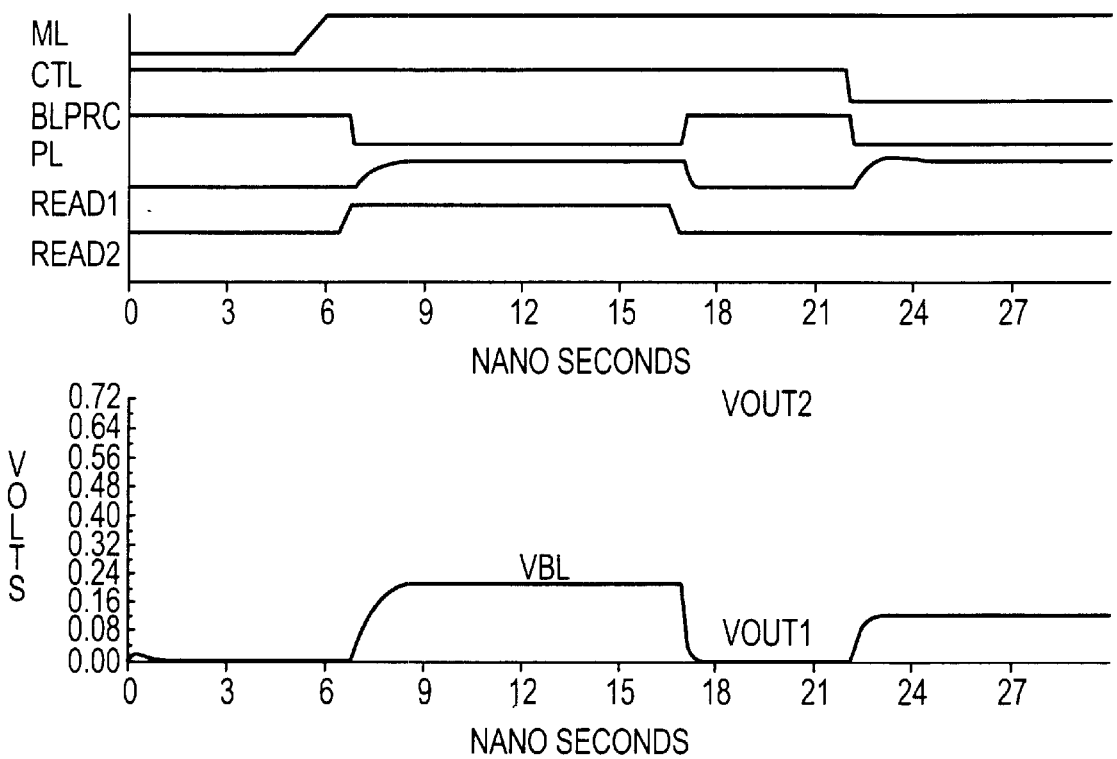
FIG. 4 is a timing diagram with simulated voltage and control waveforms for reading a logic "one" data state from a 1T/1C ferroelectric memory cell.
Figure 5:
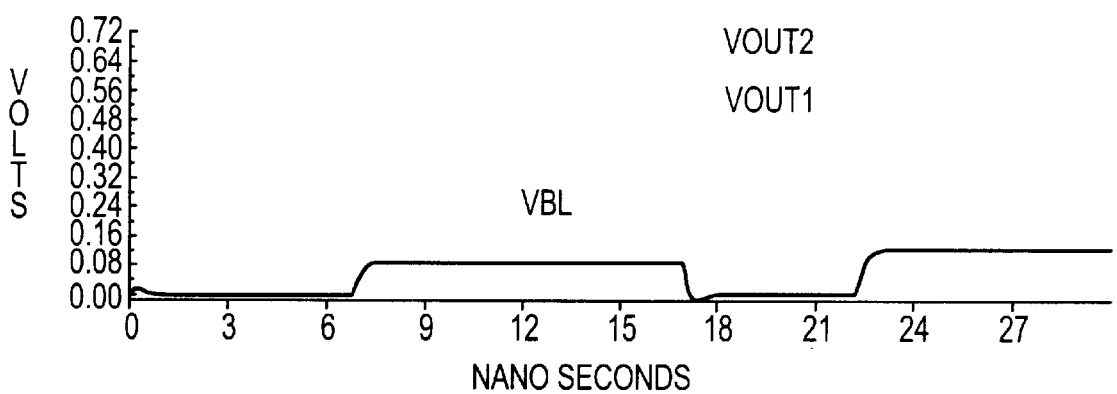
FIG. 5 is a timing diagram with simulated voltage waveforms for reading a logic "zero" data state from a 1T/1C ferroelectric memory cell.

Referring now to FIGS. 4 and 5, a memory access starts with address decoding. After a word line WL is selected from address decoding, the word line WL is pulled high at about 5 ns. The bit line is floated by pulling the bit line pre-charge control signal BLPRC low. (See FIG. 6 for the location of the BLPRC signal line 26 in a memory array.) After the bit line is floated, the plate line PL is pulled high to apply the first plate line pulse to the ferroelectric capacitor in the memory cell, and READ1 is pulled high to sample the output voltage VOUT1 from the preamplifier during the first plate line pulse. During the first plate line pulse, CTL is high to add the load capacitor CADD to the bit line. READ1 is pulled low to shut down the transistor Ml before the plate line PL becomes low. Then, BLPRC becomes high to pre-charge the bit line to ground and CTL becomes low to disconnect the load capacitor CADD from the bit line. Then, BLPRC is low to float the bit line and the plate line PL is high again to apply the second plate pulse to the ferroelectric capacitor in the memory cell. At almost the same time, READ2 is pulled high to sample the output voltage VOUT2 from the preamplifier during the second plate pulse. Finally, VOUT1 and VOUT2 are fed into a sense amplifier to resolve the data state.

The simulation results shown in FIGS. 4 and 5 are for a design in which CL is about 0.42 pF, CADD is 60% of CL, C1 and C2 are 0.04 pF, CF is about 0.28 $\mu m^2$, and the W/L of MO is 0.4/0.15 $\mu m$. For our ferroelectric thin films, 60% of CL is the optimum value for CADD. The waveforms VOUT1, VOUT2, and VBL shown in FIGS. 4 and 5 are the outputs from the preamplifier and the bit line voltage for reading a stored "one" and "zero", respectively. The control signals are the same for both cases.

Figure 6:
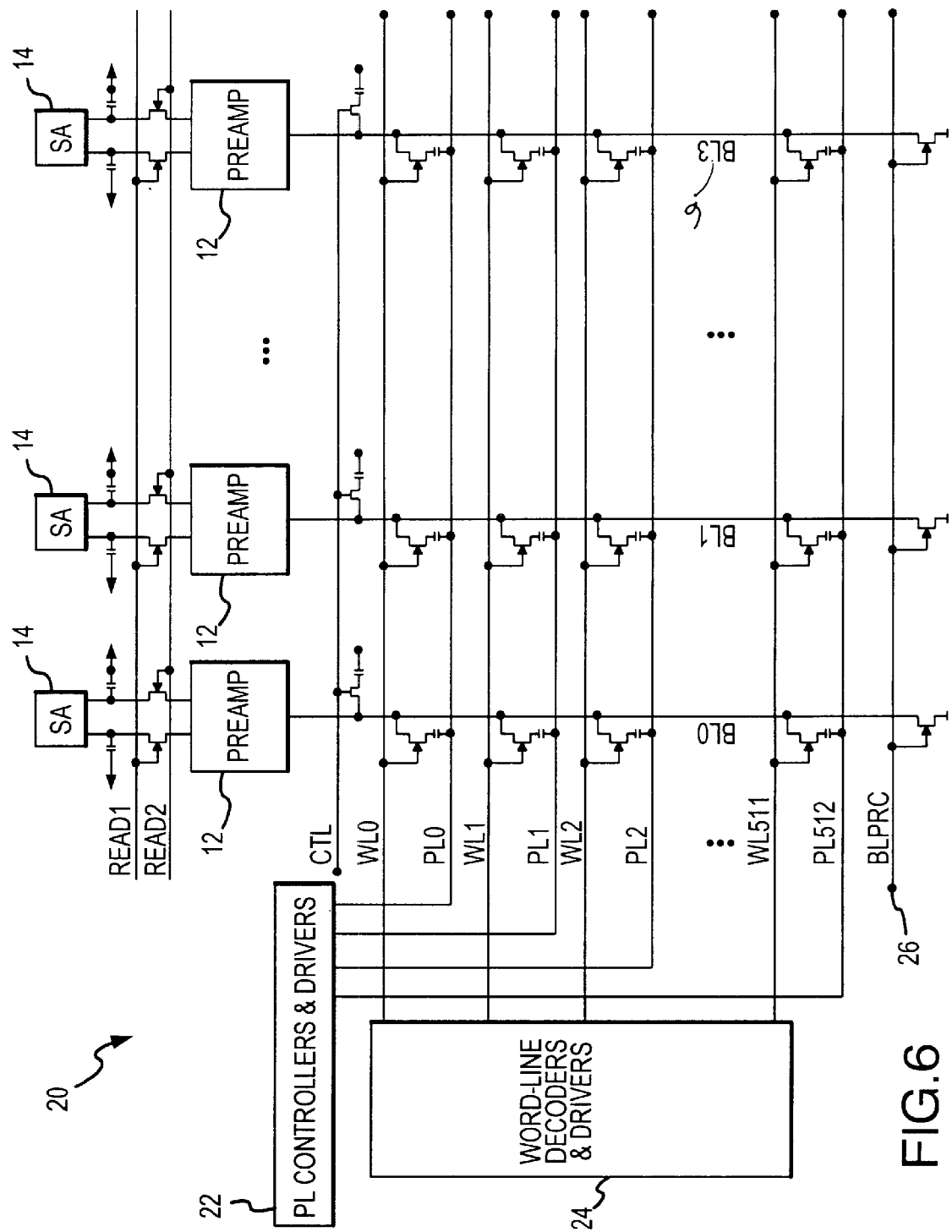
FIG. 6 is an illustration of a full 1T/1C memory array structure using the self-referencing scheme and preamplifiers of the present invention.

Referring now to FIG. 6 the structure of a 1T/1C ferroelectric memory array 20 with the self-referencing scheme and preamplifiers 12 of the present invention is shown. At the top of the array 20 are sense amplifiers 14. The sampling capacitors and their control signals READ1 and READ2 are right under the sense amplifiers 14. Under these cells are preamplifiers 12, and the load capacitors added to the bit lines controlled by CTL. The bit line pre-charge line 26 is at the bottom of array 20. Between CTL and BLPRC is the actual 1T/1C memory cell array. Each memory cell is constructed by one ferroelectric capacitor and one transistor. The gate of the transistor is connected to a world line WL0–WL511. One of the electrodes of the ferroelectric capacitor is connected to a plate line PL0–PL512 and the other is connected to the source of the transistor. World lines WL0–WL512 are controlled by word line decoders and drivers 24 and the plate lines are controlled by plate line controllers and drivers 22. The controllers for other signals are omitted for simplicity.

In operation, the load CADD capacitor is added to the BL bit line only during the first plate line pulse. There are three purposes in doing this. First, recall that in the self-referencing scheme of the present invention that the charge transferred onto the bit line BL for an original downward polarization, i.e. a P term, is always larger than that for an original upward polarization, i.e. a U term. Thus, the voltage applied to the ferroelectric memory cell capacitor CF for a data one state is smaller than that for a data zero state during the first plate line pulse. This data-dependent voltage applied on the ferroelectric capacitor is not desirable. The addition of a load capacitor to the bit line BL during the first plate line pulse reduces this difference. Second, the margins between reading a logic one and a logic zero can be optimized by adjusting the capacitance of the load capacitor. Third, by adding a capacitor to a bit line, the self-referencing scheme is realized before the preamplifier. The feeding circuit to the sense amplifier is therefore balanced between its two sides. The load on the two sides of the sense amplifier can be well balanced since a threshold on the inputs to the sense amplifier is not needed and the preamplifier isolates the sense amplifier from the bit line.

By using the preamplifiers, the signal margins are significantly increased. The self-referencing scheme without the preamplifiers has small signal margins, especially when the bit-line-to-cell ratios are high, and thus is not suitable for high-density memories. The self-referencing scheme combined with preamplifiers provides a reliable and robust way to implement high density ferroelectric memories.

Having described and illustrated the principle of the invention in a preferred embodiment thereof, it is appreciated by those having skill in the art that the invention can be modified in arrangement and detail without departing from such principles. For example, while a 512×64 memory array has been shown, it is apparent to those skilled in the art that other density memory arrays can be used. I therefore claim all modifications and variations coming within the spirit and scope of the following claims.

I claim:

1. A self-referencing read circuit for a 1T/1C ferroelectric memory comprising:
a ferroelectric memory, cell coupled to a plate line and a bit line, the bit line having an associated bit line capacitance;
a load capacitor;
means for selectively coupling the load capacitor to the bit line;
a preamplifier having an input coupled to the bit line and an output;
means for sampling a first preamplifier output voltage during the application of a first plate line pulse.;
means for sampling a second preamplifier output voltage during the application of a second plate line pulse; and a sense amplifier for comparing the first and second preamplifier output voltages to provide a data output signal.

2. The read circuit of claim 1 in which the ferroelectric memory cell comprises a ferroelectric capacitor in series with a transistor.

3. The read circuit of claim 1 in which the means for sampling a first preamplifier output voltage comprises a capacitor in series with a switch device such as a transistor or a transmission gate.

4. The read circuit of claim 1 in which the means for selectively coupling the load capacitor to the bit line comprises a capacitor in series with a switch device such as a transistor or a transmission gate.

5. The read circuit of claim 1 in which the means for sampling a second preamplifier output voltage comprises a capacitor in series with a switch device such as transistor or a transmission gate.

6. A method of reading a 1T/1C ferroelectric memory comprising
    coupling a load capacitor to a bit line;
    precharge the bit line and the load capacitor to ground;
    transferring charge from a 1T/1C memory cell to the bit line to create a first bit line voltage;
    preamplifying the first bit line voltage to create a first output voltage;
    storing the first output voltage;
    decoupling the load capacitor from the bit line;
    precharge the bit line to ground;
    transferring charge from the 1T/1C memory cell to the bit line to create a second bit line voltage;
    preamplifying the second bit line voltage to create a second output voltage;
    storing the second output voltage; and
    comparing the first and second output voltages to provide a logic output signal.

7. The method of claim 6 further comprising sizing the load capacitor such that the first output voltage is less than the second output voltage when the 1T/1C memory cell has an initial upward polarization.

8. A method of determining a polarization state in a 1T/1C ferroelectric memory cell coupled to a bit line comprising:
    applying two consecutive plate line pulses to a ferroelectric capacitor in the 1T/1C memory cell;
    preamplifying bit line voltages corresponding to the two plate line pulses; and
    comparing the magnitude of the preamplified bit line voltages to determine the polarization state of the 1T/1C ferroelectric memory cell.

9. The method of claim 8 in which applying two consecutive plate line pulses comprises applying two consecutive plate line pulses of the same polarity.

10. The method of claim 8 in which preamplifying bit line voltages comprises preamplifying two consecutive bit line voltage pulses using one signal path per bit line.

11. The method of claim 8 further comprising adding additional capacitance to the bit line during the first plate line pulse.

12. A self-referencing read circuit for a 1T/1C ferroelectric memory comprising:
    an array of ferroelectric memory cells coupled to respective plate lines, bit lines, and word lines;
    a plurality of controlled load capacitors, wherein a single load capacitor is associated with each bit line;
    a plurality of preamplifiers, each having an input coupled to the respective bit line;
    a first set of capacitors for sampling a first set of preamplifier output voltages during the application of a first plate line pulse;
    a second set of capacitors for sampling a second set of preamplifier output voltages during the application of a second plate line pulse; and
    a plurality of sense amplifiers for comparing the first and second sets of preamplifier output voltages to provide a plurality of data output signals corresponding to the data in a subset of the array of 1T/1C ferroelectric memory cells.

13. The read circuit of claim 12 in which each sense amplifier further comprises two input/outputs that are capacitively balanced.

14. The read circuit of claim 12 in which preamplifying bit line voltages comprises preamplifying two consecutive bit line voltage pulses using one signal path per bit line.

15. The read circuit of claim 12 in which preamplifying bit line voltages comprises preamplifying two consecutive bit line voltage pulses using an analogue amplifier with a single-ended input.

16. The read circuit of claim 12 in which each preamplifier comprises a high impedance input preamplifier for isolating each sense amplifier from the respective bit line.

17. The read circuit of claim 12 further comprising a driver circuit for driving each of the plate lines.

18. The read circuit of claim 12 further comprising a driver circuit for driving each of the word lines.

19. The read circuit of claim 12 in which the load capacitor is about 60% of the bit line capacitance .

20. The read circuit of claim 12 in which the bit line capacitance is about 0.42 pF.

21. The read circuit of claim 12 in which the capacitance of each capacitor in the first set of capacitors is about 0.04 pF.

22. The read circuit of claim 12 in which the capacitance of each capacitor in the second set of capacitors is about 0.04 pF.

* * * * *